(12) United States Patent
Hashimoto et al.

(10) Patent No.: US 6,645,693 B2
(45) Date of Patent: Nov. 11, 2003

(54) RESIST COMPOSITION

(75) Inventors: Kazuhiko Hashimoto, Tsukuba (JP); Yoshiko Miya, Muko (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/891,249

(22) Filed: Jun. 27, 2001

(65) Prior Publication Data

US 2002/0031718 A1 Mar. 14, 2002

(30) Foreign Application Priority Data

Jun. 30, 2000 (JP) .......................... 2000-198916

(51) Int. Cl.⁷ ............................ G03C 1/73; G03F 7/039
(52) U.S. Cl. .................... 430/270.1; 430/905; 430/907; 430/910; 430/914; 430/326
(58) Field of Search ............................ 430/270.1, 907, 430/909, 914, 325, 326, 905, 910

(56) References Cited

U.S. PATENT DOCUMENTS 6,461,789 B1 * 10/2002 Hatakeyama et al. ..... 430/270.1

OTHER PUBLICATIONS

Schmaljohann et al, *Design Strategies for 157nm Single Layer Photo Resists: Lithographic Evaluation of a Poly (a–Trifluoromethyl Vinyl Alcohol) Copolymer*, Proceedings of SPIE—The International Society for Optical Engineering, 3999 (Pt. 1, Advances in Resist Technology and Processing XVII), p. 330–334, 2000.*

* cited by examiner

*Primary Examiner*—Janet Baxter
*Assistant Examiner*—Sin J. Lee
(74) *Attorney, Agent, or Firm*—Sughrue Mion, PLLC

(57) ABSTRACT

A resist composition comprising a binder resin and a radiation-sensitive compound. The binder resin is an alkali-soluble resin or becomes alkali-soluble resin by the action of the radiation-sensitive compound after irradiation, and has a polymerization unit represented by the following formula (I):

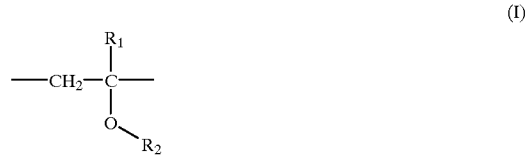

wherein, $R_1$ represents a fluoroalkyl group having 1 to 12 carbon atoms and having at least one fluorine atom, and $R_2$ represents hydrogen atom or an acyl group having 2 to 5 carbon atoms.

2 Claims, No Drawings

RESIST COMPOSITION

BACKGROUND OF THE INVENTION

1. Field of the Invention

The present invention relates to a resist composition and, more specifically, a chemical amplification type resist composition used for fine-processing of a semiconductor.

2. Description of the Related Art

A lithography process using a resist composition is usually adopted for fine-processing of a semiconductor, and in lithography, it is theoretically possible to improve resolution when the exposure wavelength is shorter, as demonstrated by the Rayleigh diffraction limit formula. Exposure light sources for lithography used for production of a semiconductor include g-line having a wavelength of 436 nm, i-line having a wavelength of 365 nm, KrF excimer laser having a wavelength of 248 nm and ArF excimer laser having a wavelength of 193 nm, the wavelength used becomes shorter gradually. In this regards, an $F_2$ excimer laser having a wavelength of 157 nm is regarded favorably as a next generation exposure light.

For KrF excimer laser exposure or ArF excimer laser exposure, a so-called "chemical amplification-type" resist utilizing a catalytic action of an acid generated by exposure is often used due to excellent sensitivity. Also for $F_2$ excimer laser exposure, there is a high possibility of use of a chemical amplification type resist from the standpoint of sensitivity.

Polyvinylphenol-based resins have been used as a resist for KrF excimer laser exposure. On the other hand, it is known that a resin having no aromatic ring for securing the transmittance of the resist and having an alicyclic ring instead of an aromatic ring for imparting dry etching-resistance is advantageous for use as a resist for ArF excimer laser exposure.

Various alicyclic resins are known such as those described in D. C. Hofer, Journal of Photopolymer Science and Technology, Vol. 9, No. 3, 387–398(1996). Further, S. Takechi et al., Journal of Photopolymer Science and Technology, Vol. 9, No. 3, 475–487 (1996) and JP-A No. 9-73173 disclose that when a polymer or copolymer of 2-methyl-2-adamantyl methacrylate is used as a resin in a chemical amplification type resist, 2-methyl-2-adamantyl dissociates by the action of an acid and acts in a positive manner, and high dry etching-resistance, high resolution and excellent adhesion to a substrate are obtained.

However, resins used in conventional resists for KrF excimer laser exposure and ArF excimer laser exposure do not have sufficient transmittance for light having a wavelength of 170 nm or less, for example, $F_2$ excimer laser having a wavelength of 157 nm. The low transmittance is disadvantageous with respect to various characteristics of the resist such as profile, contrast, sensitivity and the like.

SUMMARY OF THE INVENTION

An object of the present invention is to provide a resist composition having excellent transmittance for light having a wavelength of 170 nm or less and, particularly, is suitable for $F_2$ excimer laser lithography.

This object and other objectives have been achieved by the present inventors who have found that the transmittance at an $F_2$ excimer laser wavelength of 157 nm, for example, can be improved by using a resin having a polymerization unit derived from a monomer as defined herein as the resin constituting a resist composition, and have completed the present invention.

Namely, the present invention provides a resist composition comprising a binder resin and a radiation-sensitive compound, wherein the binder resin is an alkali-soluble resin or becomes an alkali-soluble resin by the action of the radiation-sensitive compound after irradiation, and has a polymerization unit represented by the following formula (I):

wherein, $R_1$ represents a fluoroalkyl group having 1 to 12 carbon atoms and having at least one fluorine atom, and $R_2$ represents a hydrogen atom or an acyl group having 2 to 5 carbon atoms.

DETAILED DESCRIPTION OF THE PREFERRED EMBODIMENTS

In the present invention, a resin having a polymerization unit of the above-mentioned formula (I) is used as a binder resin. This resin is obtained, for example, by polymerization using a monomer of the following formula (VI):

wherein, $R_1$ is as defined above, and $R_{10}$ represents an acyl group having 2 to 5 carbon atoms.

The fluoroalkyl represented by $R_1$ in the formula (I) may be linear or it may be branched when 3 or more carbon atoms are contained therein. Compounds of formula (VI) in which $R_1$ represents a trifluoromethyl group are commercially available and are preferred for use in the present invention from the standpoint of industrial production of resins.

Raw material for polymer of formula (VI), in which $R_{10}$ represents an acetyl group, is commercially available and preferable from the standpoint of industrial production of resins.

The following unit (Ia) is formed by polymerization of a compound of the formula (VI):

where $R_1$ and $R_{10}$ are as defined above.

The unit (Ia) can be totally or partially converted, by decomposition of ester parts, into the following unit (Ib):

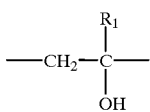
(Ib)

wherein, $R_1$ is as defined above.

The conversion from (Ia) into (Ib) can be conducted according to any suitable conventional method. For example, an alkali catalyst may be used in the presence of a lower alcohol, or heating may be utilized together with an acid catalyst in the presence of a lower alcohol, to achieve the conversion. Of course, other suitable methods will be apparent to one skilled in the art.

As specific examples of compounds of the formula (VI), the following compounds are exemplified.

1-(trifluoromethyl)vinyl acetate,
1-(difluoromethyl)vinyl acetate,
1-(fluoromethyl)vinyl acetate,
1-(2-trifluoroethyl)vinyl acetate,
1-(2,2,3,3,3-pentafluoropropyl)vinyl acetate,
1-(1-trifluoromethyl-2,2,2-trifluoroethyl)vinyl acetate,
1-(trifluoromethyl)vinyl propionate,
1-(difluoromethyl)vinyl propionate,
1-(fluoromethyl)vinyl propionate and the like.

Other suitable monomer compounds within the scope of Formula (VI) that may be used in the present invention will be apparent to one skilled in the art. The binder resin used in the present invention is alkali-soluble itself or undergoes a chemical change to become alkali-soluble by the action of a radiation-sensitive compound after irradiation.

The alkali-soluble portion of the binder resin used in the present invention can be a unit having a phenol, a unit having a (meth)acrylate with an alicyclic ring and carboxyl group on the alcohol side of the ester, a unit of an unsaturated carboxylic acid, or the like.

Specifically, alkali soluble portions of the binder resin may be a vinyl phenol, an isopropenylphenol, alicyclic esters of (meth)acrylic acid having a carboxyl group on the alicyclic ring, a (meth)acrylic acid unit, and the like. When such alkali-soluble portions are present in a relatively large amount, the resin itself becomes alkali-soluble. An alkali-insoluble portion may be present together with these portions. For example, resins in which hydroxyl groups of a vinylphenol or isopropenylphenyl are partially alkyl-etherified, resins obtained by copolymerization of vinylphenol or isopropenylphenol with other polymerizable unsaturated compounds, resins obtained by copolymerization of an alicyclic ester of (meth)acrylic acid with (meth)acrylic acid, polymer resins of a cycloolefin such as norbornene and the like, or derivatives thereof or copolymer resins of maleic anhydride, reins obtained by copolymerization with a compound produced by substituting part or all of hydrogen atoms in an alkyl ester of (meth)acrylic acid by fluorine atom, and the like, can be used as the resin which is alkali-soluble itself of the present invention provided they are totally alkali-soluble.

In the present invention, there may exist the above-described polymerization portion having an alkali-soluble group or polymerization portion having a group that undergoes a chemical change to become alkali-soluble by the action of a radiation-sensitive compound after irradiation of the binder resin, in addition to a polymerization unit of the above-mentioned formula (I).

Such a resin is produced usually by conducting, for example, copolymerization using 1-(fluoroalkyl)vinyl ester of the general formula (VI) as one monomer and a polymerizable unsaturated compound having an alkali-soluble group or a group which undergoes a chemical change to become alkali-soluble by the action of a radiation-sensitive compound after irradiation as another monomer. The copolymerization itself can be conducted according to any suitable conventional method, for example, each monomer maybe dissolved in a suitable solvent, and polymerization may be initiated in the presence of a polymerization initiator, to cause the reaction to proceed. Further, for example, in case of modification of a hydroxyl group in a vinylphenol or isopropenylphenol unit with an alkyl or a group which releases by the action of a radiation-sensitive compound after irradiation, it is general that a copolymer of a fluoroalkylvinyl ester of the formula (VI) with vinylphenol or isopropenylphenol is produced, then, a hydroxyl group in a vinylphenol group or isopropenylphenol group is modified.

By incorporating a polymerization group of the formula (I) into a binder resin, the resin exhibits excellent transmittance for light having a wavelength of 170 nm or less, for example, $F_2$ excimer laser having a wavelength of 157 nm. Therefore, it may be advantageous that a polymerization group of the formula (I) is present in such amount that such an ability can be attained, and the resin is alkali-soluble itself or becomes alkali-soluble by the action of a radiation-sensitive compound after irradiation. Depending on the kind and type of resist, it may be advantageous that the proportion of a polymer unit of formula (I) is appropriately selected in a range of from about 10 to 80 mol % based on the whole resin.

Upon irradiation, part of a resist film containing the binder resin is removed by alkali-development, and a positive resist is obtained. Namely, in a positive resist of chemical amplification type, an acid or base generated from a radiation-sensitive compound at the part irradiated with radiation is diffused by post exposure baking to dissociate a protective group of a resin and to regenerate an acid or base, and as a result, the part irradiated with radiation becomes alkali-soluble.

The chemical amplification type positive resists are classified into two kinds of resists. First, resists in which a binder resin has a protective group which can dissociate by the action of an acid or base, and which are themselves insoluble or poorly soluble in alkali, however, become alkali-soluble after dissociation of the above-mentioned protective group by the action of an acid or base. Second, resists in which a binder resin is alkali-soluble, and which contain, in addition to this binder resin and radiation-sensitive compound, a dissolution inhibitor having a protective group which can dissociate by the action of an acid or base, having themselves an ability to suppress dissolution for the alkali-soluble binder resin, however, becoming alkali-soluble after dissociation of the above-mentioned protective group by the action of an acid or base.

When a resin itself is insoluble or poorly soluble in an alkaline, however, becomes an alkali-soluble by the action of a radiation-sensitive compound after irradiation is used as a binder, a portion having such a nature can be obtained, for example, by introducing a protective group having an ability to suppress dissolution for an alkali developer, however, being able to dissociate by the action of an acid or base, into an alkali-soluble unit such as the above-exemplified unit having a phenol or the unit having a carboxyl group. The group having an ability to suppress dissolution for an alkali developer, however, being instable for an acid or base can be selected from various known protective groups.

In the present invention, the group having an ability to suppress dissolution for an alkali developer, however, being instable for an acid, may be, for example, groups in which quaternary carbon is bonded to an oxygen atom such as tert-butyl, tert-butoxycarbonyl and tert-butoxycarbonylmethyl; groups of acetal type such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl and 1-[2-(1-adamantanecarbonyloxy)ethoxy]ethyl; residues of non-aromatic cyclic compounds such as 3-oxocyclohexyl, 4-methyltetrahydro-2-pyron-4-yl(derived from mevalonic lactone) and 2-alkyl-2-adamantyl; and the like, and these groups may be substituted by hydrogen on a phenolic hydroxyl group or hydrogen on a carboxyl group. Other suitable groups having an ability to suppress dissolution for an alkali developer, however, being instable for an acid, that may be utilized in the present invention will be apparent to one skilled in the art.

These protective groups can be introduced into a resin by conducting a known protective group introducing reaction on an alkali-soluble resin having a phenolic hydroxyl group or a carboxyl group, or by conducting copolymerization using an unsaturated compound having such a group as one monomer.

Further, in the present invention, the group instable for a base may be, for example, alkylcarbamate-based or cycloalkylcarbamate-based groups. Specifically, for example, a resin obtained by substituting a part of phenolic hydroxyl groups of the resin having a phenol skeleton by an alkylcarbamoyloxy group or cycloalkylcarbamoyloxy group can be a binder resin of the present invention.

The groups which undergo chemical change to become alkali-soluble by the action of a radiation-sensitive compound after irradiation will now described. Those having a polymerization unit obtained by substitution of hydrogen on a hydroxyl group of 4-hydroxystyrene by a group dissociating by the action of an acid and/or a polymerization unit derived from 2-alkyl-2-adamantyl (meth)acrylate, are excellent in resolution and dry etching-resistance. The polymerization unit obtained by substitution of hydrogen on a hydroxyl group of 4-hydroxystyrene by a group dissociating by the action of an acid can be represented by the following formula (II):

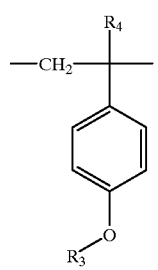

(II)

wherein, $R_3$ represents a hydrogen atom or a group dissociating by the action of an acid, and $R_4$ represents hydrogen or a methyl group.

Specific examples of $R_3$ include groups in which quaternary carbon is bonded to an oxygen atom such as tert-butyl, tert-butoxycarbonyl and tert-butoxycarbonylmethyl; groups of acetal type such as tetrahydro-2-pyranyl, tetrahydro-2-furyl, 1-ethoxyethyl, 1-(2-methylpropoxy)ethyl, 1-(2-methoxyethoxy)ethyl, 1-(2-acetoxyethoxy)ethyl, 1-[2-(1-adamantyloxy)ethoxy]ethyl and 1-[2-(1-adamantanecarbonyloxy)ethoxy]ethyl; residues of non-aromatic cyclic compounds such as 3-oxocyclohexyl, 4-methyltetrahydro-2-pyron-4-yl(derived from mevalonic lactone) and 2-alkyl-2-adamantyl; and the like. Of course, other groups which undergo chemical change to become alkali-soluble by the action of a radiation-sensitive compound after irradiation that maybe utilized in the present invention will be apparent to one skilled in the art.

Further, the binder resin of the present invention may, in addition to the polymerization unit of formula (I) further include a polymerization unit derived from a (meth)acrylate of the following formula (III):

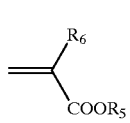

(III)

wherein, $R_5$ represents a group that dissociates by the action of an acid, and $R_6$ represents hydrogen or a methyl group, and the radiation-sensitive compound may be an acid generator generating an acid by the action of irradiation.

Specifically, polymerization units of the formula (III) in which $R_5$ represents 2-alkyl-2-adamantyl are preferred, and in this regard 2-alkyl-2-adamantyl (meth)acrylate can be represented by the following formula (VII), which by polymerization of this compound, forms a unit of the following formula (VIIa).

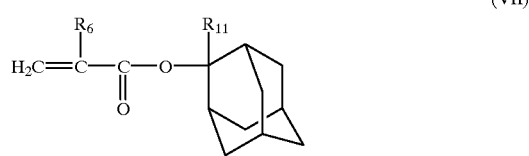

(VII)

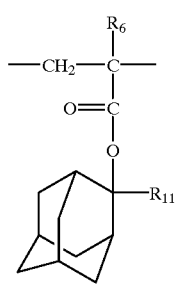

(VIIa)

$R_6$ represents hydrogen or methyl, and $R_{11}$ represents an alkyl groups. $R_{11}$ can be, for example, an alkyl group having about 1 to 8 carbon atoms, and it is preferable that $R_{11}$ is linear, however, when the alkyl group contains 3 or more carbon atoms, it may be branched. Specific examples of $R_{11}$ include methyl, ethyl, propyl, isopropyl, butyl and the like. In a polymerization unit of 2-alkyl-2-adamantyl methacrylate of the formula (VIIa), 2-alkyl-2-adamantyl dissociates by the action of an acid, therefore, a resin having this unit can be applied to a positive resin using an acid generator as a radiation-sensitive compound.

On the other hand, when alkali-soluble units is present in relatively large amount, a binder resin which is itself alkali-soluble can be combined with a dissolution inhibitor and radiation-sensitive compound to give a positive resist.

The dissolution inhibitor used when an alkali-soluble resin itself is used as a binder to give a positive resist can be a compound obtained by protecting a phenolic hydroxyl group of a phenolic compound by a group having an ability to suppress dissolution for an alkali developer, however, dissociating by the action of an acid or base.

The group dissociating by the action of an acid may, for example, be a tert-butoxycarbonyl group, and the tert-butoxycarbonyl group shall be substituted for hydrogen of a phenolic hydroxyl group. Examples of the dissolution inhibitor having a group dissociated by the action of an acid include 2,2-bis(4-tert-butoxycarbonyloxyphenyl)propane, bis(4-tert-butoxycarbonyloxyphenyl)sulfone, 3,5-bis(4-tert-butoxycarbonyloxyphenyl)-1,1,3-trimethylindane and the like.

On the other hand, groups dissociating by the action of a base include, for example, alkylcarbamate or cycloalkylcarbamate-based groups. Further, compounds obtained by substituting a phenolic hydroxyl group by an alkylcarbamoyloxy group or cycloalkylcarbamoyloxy group can be used as a dissolution inhibitor having a group dissociating by the action of a base. When such a dissolution inhibitor is used, a binder component means a binder resin and a dissolution inhibitor. Of course, other suitable dissolution inhibitors that may be utilized in the present invention will be apparent to one skilled in the art.

On the other hand, a negative resist is obtained when the binder resin is alkali-soluble, and the part of the resist film irradiated with radiation and containing this binder resin is hardened and not removed by alkali-development. Namely, in a chemical amplification type negative resist, it is usual that the binder resin is alkali-soluble, and a cross-linking agent is present in addition to this binder resin as well as a radiation-sensitive component. An acid or base generated from the radiation-sensitive compound at the irradiated part is diffused by post exposure baking and acts on the cross-linking agent to harden the binder resin at the irradiated part to give alkali-insolubility.

In this case, the binder may contain a polymerization unit of the following formula (V) for regulating the dissolving speed into a developer, in addition to the polymerization unit of formula (I) and the above-mentioned alkali-soluble portion:

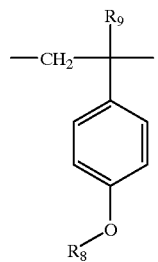

(V)

wherein, $R_8$ represents hydrogen atom, an alkyl group which may be linear, branched or cyclic, or an acyl group, and $R_9$ represents hydrogen or a methyl group, and specific examples of $R_8$ include methyl, ethyl, propyl, isopropyl, butyl, acetyl or the like.

The cross-linking agent used when an alkali-soluble resin itself is used as a binder to give a negative resist may be any suitable cross-linking agent which cross-links a binder resin by the action of an acid or base. Cross-linking agents often cause a cross-linking reaction by the action of an acid, and usually, a compound having a methylol group or an alkyl ether body thereof is used.

Specific examples thereof include methylolated melamines or alkyl ether thereof such as hexamethylolmelamine, pentamethylolmelamine, tetramethylolmelamine, hexamethoxymethylmelamine, pentamethoxymethylmelamine and tetramethoxymethylmelamine; methylolated benzoquanamine or alkyl ether thereof such as tetramethylolbenzoguanamine, tetramethoxymethylbenzoguanamine and trimethoxymethylbenzoguanamine; 2,6-bis(hydroxymethyl)-4-methylphenol or alkyl ether thereof; 4-tert-butyl-2,6-bis(hydroxymethyl) phenol or alkyl ether thereof; 5-ethyl-1,3-bis(hydroxymethyl)perhydro-1,3,5-triazin-2-one (trivial name: N-ethyldimethyloltriazone) or alkyl ether thereof; N,N-dimethylolurea or alkyl ether thereof; 3,5-bis(hydroxymethyl)perhydro-1,3,5-oxadiazin-4-one (trivial name: dimethylolurone) or alkyl ether thereof; tetramethylolglyoxaldiureine or alkyl ether thereof; and the like. Other cross-linking agents suitable for use in the present invention will be apparent to one skilled in the art.

Examples of the binder resin into which a polymerization unit of the formula (I) may be incorporated, and which itself is alkali-soluble or causes chemical change to become alkali-soluble by the action of a radiation-sensitive compound after irradiation are as follows:

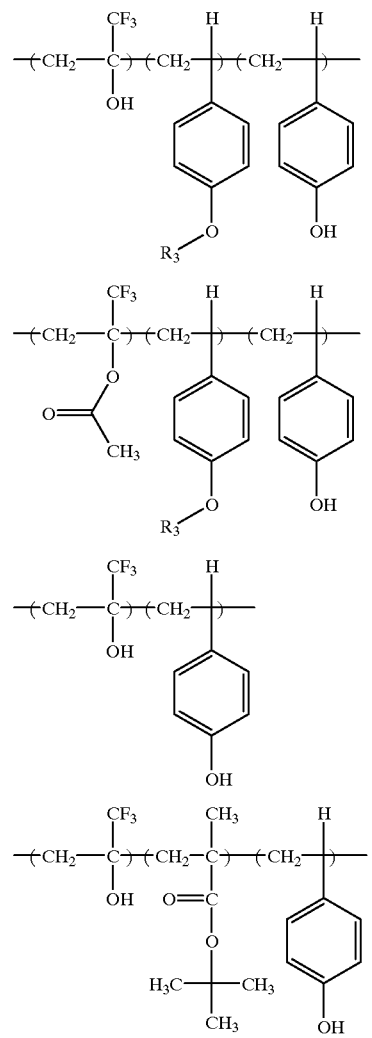

-continued

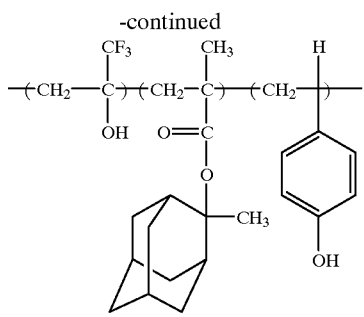

wherein, $R_3$ is as define above. Other suitable binder resins will be apparent to one skilled in the art.

The chemical amplification type resist of the present invention contains a resin which is alkali-soluble or can become alkali-soluble as described above as a binder resin, and further contains a radiation-sensitive compound that dissociates when irradiated. An acid generator that generates an acid when irradiated is used as the radiation-sensitive compound, when the binder resin has a group that dissociates by the action of an acid and is insoluble or poorly soluble in an alkali, however, becomes alkali-soluble after dissociation of the group dissociated by the action of an acid, and acts in a positive manner, or when the binder resin is alkali-soluble, uses a compound having a group that dissociates by the action of an acid as a dissolution inhibitor, and acts in a positive manner.

Further, in the case of a negative resist using a binder resin which is alkali-soluble, and containing a cross-linking agent, the cross-linking agent often causes a cross-linking reaction by the action of an acid, therefore, an acid generator is also used as the radiation-sensitive compound.

On the other hand, a base generator generating a base by the action of irradiation is used as the radiation-sensitive compound, when the binder resin is alkali-soluble, and a compound having a group that dissociates by the action of a base as the dissolution inhibitor is used and acts in a positive manner, or when the binder resin has a group dissociated by the action of a base, and acts in a positive manner.

Acid generating compounds that may be used as radiation-sensitive compounds can be any suitable compounds which generates an acid when the substance itself is irradiated or a resist composition containing the substance is irradiated. For example, onium salts, halogenated alkyltriazine-based compounds, disulfone-based compounds, compounds having a diazomethanesulfonyl skeleton, sulfonate ester-based compounds and the like may be utilized in the present invention. Specific examples of such an acid generator are listed below.

Onium Salt
Diphenyliodonium trifluoromethanesulfonate,
4-methoxyphenylphenyliodonium hexafluoroantimonate,
4-methoxyphenylphenyliodonium trifluoromethanesulfonate,
bis(4-tert-butylphenyl)iodonium tetrafluoroborate,
bis (4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thioranium hexafluoroantimonate,
1-(2-naphthoylmethyl)thioranium trifluoromethanesulfonate,
4-hydroxy-1-naphthyldimethylsulfonium hexafluoroantimonate,
4-hydroxy-1-naphthyldimethylsulfonium trifluoromethanesulfonate, and the like.
Halogenated Alkyltriazine-based Compounds
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine and the like.
Disulfone-based Compound
Diphenyl disulfone,
Di-p-tolyl disulfone,
Phenyl p-tolyl disulfone,
Phenyl p-methoxyphenyl disulfone and the like.
Compound Having Diazomethanesulfonyl Skeleton
Bis(phenylsulfonyl)diazomethane,
Bis(4-chlorophenylsulfonyl)diazomethane,
Bis(p-tolylsulfonyl)diazomethane,
Bis(4-tert-butylphenylsulfonyl)diazomethane,
Bis(2,4-xylylsulfonyl)diazomethane,
Bis(cyclohexylsulfonyl)diazomethane,
(Benzoyl)(phenylsulfonyl)diazomethane and the like.
Sulfonate-based Compound
1-benzoyl-1-phenylmethyl p-toluenesulfonate (trivial name: benzointosylate),
2-benzoyl-2-hydroxy-2-phenylethyl p-toluenesulfonate (trivial name: α-methylolbenzoin tosylate),
1,2,3-benzenetolyl trismethanesulfonate,
2,6-dinitrobenzyl p-toluenesulfonate,
2-nitrobenzyl p-toluenesulfonate,
4-nitrobenzyl p-toluenesulfonate,
N-(phenylsulfonyloxy)succinimide,
N-(p-tolylsulfonyloxy)succinimide,
N-(trifluoromethylsulfonyloxy)succinimide,
N-(isopropenylsulfonyloxy)succinimide,
N-(n-butylsulfonyloxy)succinimide,
N-(n-hexylsulfonyloxy)succinimide,
N-(10-camphorsulfonyloxy)succinimide, N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy) naphthalimide and the like.
Other acid generating compounds suitable for use in the present invention will be apparent to one skilled in the art.

Base generating compounds that may be used as the radiation-sensitive compounds of the present invention also can be any suitable compound which generates a base when the substance itself is irradiated or a resist composition containing the substance is irradiated. Specific examples thereof include 2-nitrobenzyl cyclohexylcarbamate, 2,6-dinitrobenzyl cyclohexylcarbamate, formanilide, triphenylsulfonium hydroxide and the like. These compounds are decomposed when irradiated to produce an amine or hydroxyl anion. Other base generating compounds suitable for use in the present invention will be apparent to one skilled in the art.

In a resist composition of chemical amplification type using an acid generator, it is generally known that by adding, as a quencher, basic compounds, particularly basic nitrogen-containing organic compounds, for example, amines, deterioration in abilities due to deactivation of an acid after irradiation can be suppressed. In the present invention, when an acid generator is used as a radiation-sensitive compound, compounding of such a basic compound into the resist composition is preferable. Specific examples of basic compounds that may be used as a quencher include the following:

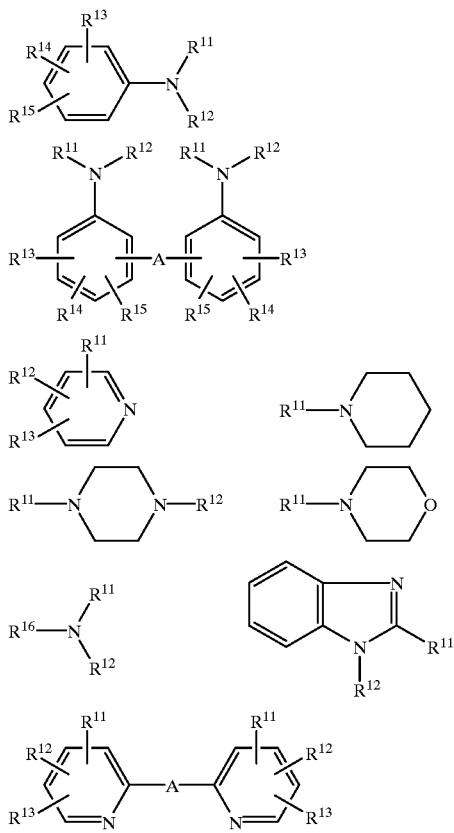

wherein, each of $R^{11}$ and $R^{12}$ independently represents a hydrogen atom, an alkyl group which may be substituted with a hydroxyl group, a cycloalkyl or aryl group, each of $R^{13}$, $R^{14}$ and $R^{15}$ independently represents a hydrogen atom, an alkyl group which may be substituted with a hydroxyl group, a cycloalkyl, aryl or alkoxy group, $R^{16}$ represents an alkyl group which may be substituted with a hydroxyl group, or cycloalkyl group, and A represents an alkylene, carbonyl or imino group. The alkyl group of $R^{11}$ to $R^{16}$ and the alkoxy group of $R^{11}$ to $R^{15}$ have about 1 to 6 carbon atoms, the cycloalkyl group of $R^{11}$ to $R^{16}$ has about 5 to 10 carbon atoms, and the aryl group of $R^{11}$ to $R^{15}$ has about 6 to 10 carbon atoms. The alkylene group of A has about 1 to 6 carbon atoms, and may be linear or branched.

Further, hindered amine compounds having a piperidine skeleton as disclosed in JP-A No. 11-52575 can also be used as a quencher. Other basic compounds suitable for use in the resist composition of the present invention will be apparent to one skilled in the art.

It is preferable that the resist composition of the present invention contains a binder component in an amount of about 60 to 99.9% by weight and a radiation-sensitive compound in an amount of about 0.1 to 20% by weight based on the total weight of all solid components. When a dissolution inhibitor is used in the case of a positive resist, it is preferable that the dissolution inhibitor is present in an amount of about 5 to 40% by weight based on the total weight of all solid components of the resist composition. In the case of a negative resist, it is preferable that a cross-linking agent is present in an amount of about 1 to 30% by weight based on the total weight of all solid components of the resist composition.

When the binder resin becomes alkali-soluble by the action of a radiation-sensitive compound after irradiation, and acts in a positive manner, and most of a resist composition is occupied with a binder resin and a radiation-sensitive compound, it is preferable that the amount of the binder resin is about 80% by weight or more based on the total weight of all solid components in the composition.

When the radiation-sensitive compound is an acid generator and a basic compound is used as a quencher, it is preferable that the basic compound is present in an amount of about 0.01 to 1% by weight based on the total amount of all solid components of the resist composition. This composition can also contain, if necessary, a small amount of various additives such as a sensitizer, other resins, surfactant, stabilizer, dye and the like.

The resist composition of the present invention may be a resist solution in which the above-mentioned components are dissolved in a solvent, which is applied on a substrate such as a silicon wafer and the like according to a conventional method such as spin coating and the like. The solvent may be any suitable solvent which dissolves the components, has a suitable drying speed, and provided a uniformly coated film after evaporation of the solvent. Solvents usually used in this field can be used.

For example, the solvent may be glycol ether esters such as ethylcellosolve acetate, methylcellosolve acetate and propylene glycol monomethyl ether acetate; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; cyclic esters such as γ-butyrolactone. These solvents can be used alone or in combination thereof. Other solvents suitable for use in the present invention will be apparent to one skilled in the art.

On a resist film which has been applied on a substrate and dried, exposure treatment is performed for patterning, then, heating treatment is conducted for promoting a de-protecting group reaction or across-linking reaction, then, development is conducted using an alkali developer. Alkali developers suitable for use in the present invention can be selected from various alkali developers used in this field, including for example, aqueous solutions of tetramethylammonium hydroxide and (2-hydroxyethyl)trimethylammonium hydroxide (trivial name; choline). Other alkali developers suitable for use in the present invention will be apparent to one skilled in the art.

EXAMPLES

The following examples illustrate the present invention further in detail, but are not intended to limit the scope of the present invention.

Parts in the examples are by weight unless otherwise stated. The weight-average molecular weight was measured by gel permeation chromatography using polystyrene as a standard.

Resin Synthesis Example 1

Into a 100 mL flask equipped with a magnetic stirrer, cooling tube, thermometer and nitrogen introducing tube was charged 4.62 g of 1-(trifluoromethyl)vinyl acetate, 21.15 g of p-t-butoxystyrene and 25 g of 2-propanol. After purging with nitrogen, the mixture was heated up to 75° C., and a solution prepared by dissolving 0.62 g of azobisisobutyronitrile in 6.2 g of methyl isobutyl ketone was added dropwise over 30 minutes. Then, the mixture was kept at 75° C. for 8 hours. Then, into a mixed solution of 300 g of methanol and 150 g of water was poured the reaction solution, and the deposited resin was dissolved in methyl isobutyl ketone and concentrated to obtain 30.5 g of a resin solution.

To this resin solution was added 125 g of methyl isobutyl ketone, 3.4 g of n-toluenesulfonic acid and 10.8 g of water, and the mixture was kept at 70° C. for 15 hours. This reaction solution was washed five times with water and concentrated, then, dropped in 1000 g of n-hexane, and the deposited resin was filtered and dried under reduced pressure to obtain a resin. The yielded amount was 15.5 g. This resin is called Resin A.

Example 1 and Comparative Example 1

The following components were mixed, and further filtered through a fluorine resin filter having a pore diameter of 0.2 μm to prepare a resist solution. Resin X used in Comparative Example 1 is a resin obtained by protecting hydroxyl groups in poly(p-vinylphenol) (tradename: "VP-2500", manufactured by Nippon Soda Co., Ltd. K.K.) by an isopropyl group at an average protection rate of 20%.
Resin (as solid component)
  (A (Example 1) or X (Comparative Example 1))
  10 parts
Cross-linking agent: hexamethoxymethylmelamine
  0.5 parts
Acid generator: N-(isopropylsulfonyloxy)succineimide
  11 parts
Quencher: 1,3-di(4-pyridyl)propane
  0.0125 parts
Solvent (including incorporated resin): propylene glycol monomethyl ether acetate
  100 parts Onto a silicon wafer, "DUV-42", a composition for organic reflection preventing film manufactured by Brewer was applied, and baked at 215° C. for 60 seconds to form an organic reflection preventing film having a thickness of 600 Å, and on this was spin-coated the above-prepared resist solution so that the film thickness after drying was 0.523 μm. After application of the resist solution, the film was pre-baked on a direct hot plate at 100° C. for 60 seconds.

On the wafer on which a resist film had been thus formed, line and space patterns were exposed while gradually changing the exposure amount using KrF Excimer Stepper ("NSR 2205EX-12B" manufactured by Nikon Corp. , NA=0.55, σ=0.8). After exposure, post exposure bake (PEB) was conducted at 105° C. for 60 seconds on a hot plate, and further, paddle development was conducted using a 2.38 wt % tetramethylammonium hydroxide aqueous solution for 60 seconds. Line and space patterns after exposure were observed by a scanning electron microscope, and the effective sensitivity and resolution were checked. Effective sensitivity: It was indicated by the exposure amount using KrF Excimer Stepper when 0.20 μm line and space pattern was 1:1.

Resolution: It was indicated by the minimum size of line and space patterns separating at exposure amount of the effective sensitivity.

On the other hand, the above-prepared resist solution was applied on a magnesium fluoride wafer so that the film thickness after drying was 0.1 μm, and the film was pre-baked on a direct hot plate at 100° C. for 60 seconds to form a resist film. The transmittance of the thus formed resist film at a wavelength of 157 nm was measured using a transmittance measuring function of a simple type $F_2$ excimer exposing machine ("VUVE-4500", manufactured by Lithotech Japan), and the results shown in Table 1 were obtained.

Further, on a silicon wafer which had been treated at 23° C. for 20 seconds using hexamethylsilazane, the above-prepared resist solution was spin-coated so that the film thickness after drying was 0.10 μm. After application of the resist solution, the film was pre-baked on a direct hot plate at 10° C. for 60 seconds.

On the wafer on which a resist film had been thus formed, open frame exposure was conducted while gradually changing the exposure amount using a simple type $F_2$ excimer exposing machine ("VUVE-4500", manufactured by Lithotech Japan). After exposure, post exposure bake (PEB) was conducted at 105° C. for 60 seconds on a hot plate, and further, paddle development was conducted using a 2.38 wt % tetramethylammonium hydroxide aqueous solution for 60seconds. The minimum exposure amount when the residual film thickness of the wafer after development (hardening sensitivity) was measured, to obtain the results shown in Table 1.

TABLE 1

| | Resin | Transmittance (%) | Effective sensitivity (KrF) mJ/cm$^2$ | Resolution (KrF) μm | Hardening sensitivity (F$_2$) mJ/cm$^2$ |
| --- | --- | --- | --- | --- | --- |
| Example 1 | A | 30 | 78 | 0.21 | 3 |
| Comparative example 1 | X | 27 | 27 | 0.16 | 0.5 |

Resin Synthesis Example 2

Into a 100 mL flask equipped with a magnetic stirrer, cooling tube, thermometer and nitrogen introducing tube was charged 6.3 g of Resin A, 44 g of methyl isobutyl ketone and 0.008 g of 2-toluenesulfonic acid and they were stirred to dissolved. 2.1 g of ethyl vinyl ether was charged while maintaining the temperature at 20° C. and stirred at room temperature for 4 hours. This reaction solution was washed five times with water and concentrated, then, dropped in 300 g of n-hexane, and the deposited resin was filtered and dried under reduced pressure to obtain a resin. The yielded amount was 6.2 g. The 1-ethoxyethylated ratio obtained from an integrated value of a peak at 6 to 6.7 ppm and a peak at 6.9 to 8.2 ppm according to 1H-NMR was 68%. This resin is called Resin B.

Resin Synthesis Example 3

A resin was obtained in the same operation as for Resin Synthesis Example 2 except that the amount of ethyl vinyl ether was 1.1 g. The yielded amount was 7.2 g. The 1-ethoxyethylated ratio obtained from an integrated value of a peak at 6 to 6.7 ppm and a peak at 6.9 to 8.2 ppm according to 1H-NMR was 38%. This resin is called Resin C.

Resin Y: Production of partially 1-ethoxyethyleated substance of polyhydroxystyrene Into a 1 liter eggplant-like flask was placed 40 g of poly(p-hydroxystyrene) (tradename: "VP-15000", manufactured by Nippon Soda Co., Ltd. K.K.) (333 mmol in terms of p-hydroxystyrene unit) and 47 mg (0.25 mmol) of p-toluenesulfonic acid monohydrate, and they were dissolved in 720 g of propylene glycol monomethyl ether acetate. This solution was distilled under reduced pressure at a temperature of 60° C. and a pressure of 10 Torr or less, and dehydrated azeotropically. The amount of the solution after distillation was 337 g.

This solution was transferred into a 500 ml four-necked flask purged with nitrogen, onto this was added 12.0 g (166 mmol) of ethyl vinyl ether dropwise, then, they were reacted at 25° C. for 5 hours. To this reaction solution was added 62.3 g of propylene glycol monomethyl ether acetate and 320 g of methyl isobutyl ketone, and further, 240 ml of ion exchanged water was added and the mixture was stirred. Then, the mixture was allowed to stand still, and the organic layer portion was separated out.

To this organic layer was added again 240 ml of ion exchanged water, the mixture was stirred before it was allowed to stand still, and washed by liquid separation. Washing with ion exchange water and liquid separation were repeated once more, then, the organic layer water separated out, and distilled under reduced pressure to remove water and methyl isobutyl ketone by azeotropy with propylene glycol monomethyl ether acetate.

The resulted liquid was a solution of a resin in which hydroxyl groups of poly(p-hydroxystyrene) had been partially 1-ethoxyethyl etherified, and this resin was analyzed by 1H-NMR to find that 40% of hydroxyl groups had been 1-ethoxyethyl etherified. This resin is called Y.

Example 2 and Comparative Example 2

The following components were mixed, and further filtered through a fluorine resin filter having a pore diameter of 0.2 μm to prepare a resist solution.

Resin (as solid component)
  (B/C=1/1 (Example 2), Y (Comparative Example 2))
    10 parts
  Acid generator: p-tolyldiphenylsulfonium perfluorooctanesulfonate
    0.4 parts
  Quencher: tetramethylammonium hydroxide
    0.01 parts
  Solvent (including incorporated resin): propylene glycol monomethyl ether acetate
    100 parts Onto a silicon wafer, "DUV-42", a composition for organic reflection preventing film manufactured by Brewer was applied, and baked at 215° C. for 60 seconds to form an organic reflection preventing film having a thickness of 600 Å, and on this was spin-coated the above-prepared resist solution so that the film thickness after drying was 0.523 μm. After application of the resist solution, the film was pre-baked on a direct hot plate at 90° C. for 60 seconds.

On the wafer on which a resist film had been thus formed, line and space patterns were exposed while gradually changing the exposure amount using KrF Excimer Stepper ("NSR2205EX-12B" manufactured by Nikon Corp., NA=0.55, σ=0.8). After exposure, post exposure bake (PEB) was conducted at 100° C. for 60 seconds on a hot plate, and further, paddle development was conducted using a 2.38 wt % tetramethylammonium hydroxide aqueous solution for 60 seconds. Line and space patterns after exposure were observed by a scanning electron microscope, and the effective sensitivity and resolution were checked. Effective sensitivity: It was indicated by the exposure amount using KrF Excimer Stepper when 0.20 μm line and space pattern was 1:1.

Resolution: It was indicated by the minimum size of line and space patterns separating at exposure amount of the effective sensitivity.

On the other hand, the above-prepared resist solution was applied on a magnesium fluoride water so that the film thickness after drying was 0.1 μm, and the film was pre-baked on a direct hot plate at 90° C. for 60 seconds to form a resist film. The transmittance of thus formed resist film at a wavelength of 157 nm was measured using transmittance measuring function of a simple type $F_2$ excimer exposing machine ("VUVES-4500", manufactured by Lithotech Japan), and the results shown in Table 1 were obtained.

Further, on a silicon wafer which had been treated at 23° C. for 20 seconds using hexamethylsilazane, the above-prepared resist solution was spin-coated so that the film thickness after drying was 0.10 μm. After application of the resist solution, the film was pre-baked on a direct hot plate at 90° C. for 60 seconds.

On the wafer on which a resist film had been thus formed, open frame exposure was conducted while gradually changing the exposure amount using a simple type $F_2$ excimer exposing machine ("VUVES-4500", manufactured by Lithotech Japan).

After exposure, post exposure bake (PEB) was conducted at 100° C. for 60 seconds on a hot plate, and further, paddle development was conducted using a 2.38 wt % tetramethylammonium hydroxide aqueous solution for 60 seconds. The minimum exposure amount when the resist manifested film permeation (film permeation sensitivity) was checked by visually observing the wafer after development, to obtain the results shown in Table 2.

TABLE 2

| | Resin | Transmittance (%) | Effective sensitivity (KrF) mJ/cm$^2$ | Resolution (KrF) μm | Film permeation sensitivity ($F_2$) mJ/cm$^2$ |
| --- | --- | --- | --- | --- | --- |
| Example 2 | B/C = 1/1 | 33 | 39 | 0.16 | 3 |
| Comparative example 2 | Y | 29 | 28 | 0.17 | 0.8 |

The resist composition of the present invention exhibits high transmittance, particular in, upon exposure using light sources having a wavelength of 170 nm or less. For example, upon exposure by $F_2$ excimer laser having a wavelength of 157 nm, excellent resolution and sufficient contrast even in KrF exposure is achieved. Therefore, this resist composition can manifest excellent abilities as a chemical amplification type resist using light sources having a wavelength of 170 nm or less.

The invention being thus described, it will be apparent that the some may be varied in many ways. Such variations are to be regarded as within the spirit and scope of the invention, and all such modifications as would be apparent to one skilled in the art are intended to be included within the scope of the following claims.

What is claimed is:

1. A resist composition, comprising a binder resin and a radiation-sensitive compound, wherein said binder resin is an alkali-soluble resin or becomes an alkali-soluble resin by the action of said radiation-sensitive compound after irradiation, and comprises a polymerization unit represented by the following formula (I):

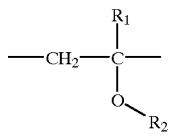

(I)

wherein, $R_1$ represents a fluoroalkyl group having 1 to 12 carbon atoms and having at least one fluorine atom, and $R_2$ represents a hydrogen atom or an acyl group having 2 to 5 carbon atoms, and a polymerization unit derived from a (meth)acrylate represented by the following formula (III):

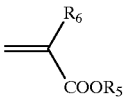

(III)

where in $R_5$ represents a group dissociated by the action of an acid, and $R_6$ represents a hydrogen atom or a methyl group, and wherein the radiation-sensitive compound is a compound that generates an acid by the action of irradiation and acts in a positive manner.

2. The composition according to claim 1, wherein $R_5$ represents a 2-alkyl-2-adamantyl group.

* * * * *